United States Patent
Lii et al.

(10) Patent No.: US 7,656,042 B2
(45) Date of Patent: Feb. 2, 2010

(54) STRATIFIED UNDERFILL IN AN IC PACKAGE

(75) Inventors: Mirng-Ji Lii, Hsinchu (TW); Szu Wei Lu, Hsinchu (TW); Tjandra Winata Karta, Hsinchu (TW); Chien-Hsiun Lee, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 338 days.

(21) Appl. No.: 11/393,050

(22) Filed: Mar. 29, 2006

(65) Prior Publication Data

US 2007/0238220 A1     Oct. 11, 2007

(51) Int. Cl.
    *H01L 23/48* (2006.01)
(52) U.S. Cl. ............... 257/778; 438/108; 257/E21.503; 257/E21.508
(58) Field of Classification Search ........... 257/772, 257/778, 787, 789, 790, E21.503, E21.508; 438/108, 112, 124, 126

See application file for complete search history.

(56) References Cited

U.S. PATENT DOCUMENTS

| | | | |
|---|---|---|---|
| 6,369,451 B2 | 4/2002 | Lin | |
| 6,475,828 B1 | 11/2002 | Hoang | |
| 6,740,823 B2 * | 5/2004 | Shimizu | 174/260 |
| 6,773,958 B1 | 8/2004 | Wang | |
| 6,774,493 B2 * | 8/2004 | Capote et al. | 257/778 |
| 6,815,831 B2 | 11/2004 | Dias | |
| 7,009,307 B1 * | 3/2006 | Li | 257/783 |
| 2004/0026782 A1 | 2/2004 | Anzai | |
| 2005/0006766 A1 | 1/2005 | Takubo et al. | |
| 2005/0087891 A1 | 4/2005 | Rumer et al. | |

* cited by examiner

*Primary Examiner*—Quoc D Hoang
(74) *Attorney, Agent, or Firm*—Duane Morris LLP; Steve E. Koffs (57) ABSTRACT

A method includes joining an integrated circuit die having at least one low-k dielectric layer to a package substrate or printed circuit board using a plurality of solder bumps located between the die and the package substrate or printed circuit board. The low-k dielectric layer has a dielectric constant of about 3.0 or less. The solder bumps have a lead concentration of about 5% or less. A stratified underfill is formed between the die and the package substrate or printed circuit board.

22 Claims, 5 Drawing Sheets

STRATIFIED UNDERFILL IN AN IC PACKAGE

FIELD OF THE INVENTION

The present invention relates to semiconductor fabrication generally, and more specifically to integrated circuit (IC) packages and packaging methods.

BACKGROUND

Flip chip technology provides a method for connecting an integrated circuit (IC) die to a substrate within a package or directly to a printed circuit board (PCB). In the flip chip method, a plurality of electrical terminals (pads) are formed on an active face of the die. A respective solder bump is formed on each of the electrical terminals. The package substrate or printed circuit board has a plurality of terminal pads corresponding to the terminals on the die. A plurality of solder bumps are formed, either on the die or on the terminal pads of the package substrate or PCB, on the side facing the die. These bumps can be heated to reflow the solder and form electrical and mechanical connections between the die and the package substrate or PCB. The die is "flipped," so that the terminals of the device face the terminal pads of the package substrate or printed circuit board. Heat is applied to reflow the solder bumps, forming electrical and mechanical connections between the substrate (or PCB) and the active face of the die. An underfill material can be filled into the space between the die and the substrate (or PCB) to strengthen the die/substrate adhesion, redistribute thermal mismatch loading, and protect the solder connections.

The die and the package substrate or PCB typically have very different coefficients of thermal expansion (CTE) from each other. For example, the CTE of Silicon is between about 2 ppm/C and about 5 ppm/C, the CTE for the organic package substrate may be about 16 ppm/C, and the CTE for solder is typically between about 20 ppm/C and 30 ppm/C. If no underfill material is employed, the flip chip solder bumps provide the only adhesion between the die and the substrate and are fully exposed to the thermal induced stresses. Repeated thermal cycling causes the solder bumps to fail (fatigue failure) by loss of adhesion at the interface or formation of stress induced cracks within the solder bumps. The reliability of the solder bumps is related to the stress/strain behaviors under cyclical thermal deformation. Reducing the stress/strain on solder bumps improves reliability and increases fatigue life. Therefore, it is common to provide an underfill material to fill the gap between the die and the package substrate or printed circuit board.

Typical underfill materials have CTE values between about 30 ppm/C and about 50 ppm/C. The underfill absorbs some of the residual stresses, to reduce the stress within the solder balls, and in the interfaces between the solder balls and the die.

The semiconductor industry is moving towards increasing use of copper metal and low-k dielectric materials in place of aluminum and silicon dioxide. Copper reduces the resistance of the metal interconnect lines (and increases their reliability), while low-k dielectrics (having dielectric constant k less than 3.9, the k value of silicon dioxide) reduce the parasitic capacitance between the metal lines. It is expected that use of low k dielectric materials will increase significantly at the 65 nanometer node, and that use of extreme low-k (ELK) dielectric materials (k between 2.0 and 2.5) will increase significantly at the 45 nanometer node.

The use of low-k dielectric materials in the interconnect layers increases the thermal mismatch problem for flip chip packages. Low-k dielectric materials may have CTE values of about 8 ppm/C., the flip chip package with an underfill generates high stress on the low-k layers and impacts the reliability of low-k/ELK flip chip packages.

The thermal mismatch problem is increased further by the use of lead-free (LF) packages. With LF bumps, solder and intermetallic compounds (alloys) are too brittle and can cause cracking of the bumps.

Current low stress and low glass transition temperature (Tg) underfill materials suitable for eutectic (EU)/high lead (HL) solder cannot adequately protect lead-free bumps. Currently available combinations of LF solder and underfill materials are not suitable for low-k flip chip packages. In packages using a conventional LF solder and low-k dielectric, solder bumps were observed to crack and the substrate traces broke during a temperature cycling test. Underfill delamination was also observed after ball mount and pre-conditioning.

Improved packaging methods and structures are desired.

SUMMARY OF THE INVENTION

In some embodiments, a semiconductor package comprises an integrated circuit die having at least one low-k dielectric layer joined to a package substrate or printed circuit board using a plurality of solder bumps located between the die and the package substrate or printed circuit board. The low-k dielectric layer has a dielectric constant of about 3.0 or less, the solder bumps has a lead concentration of about 5% or less. An underfill layer is between the die and the package substrate or printed circuit board. A buffer layer is between the underfill layer and the integrated circuit die.

In some embodiments, a structure comprises an integrated circuit die including at least one low-k dielectric layer having a dielectric constant of about 3.0 or less. A package substrate or printed circuit board is included. A plurality of solder bumps are located between the die and the package substrate or printed circuit board. The plurality of solder bumps have a lead concentration of about 5% or less. A stratified underfill layer is between the die and the package substrate or printed circuit board.

In some embodiments, a method of forming a semiconductor package comprises joining an integrated circuit die having at least one low-k dielectric layer to a package substrate or printed circuit board using a plurality of solder bumps located between the die and the package substrate or printed circuit board. The low-k dielectric layer has a dielectric constant of about 3.0 or less. The solder bumps have a lead concentration of about 5% or less. A stratified underfill layer is formed between the die and the package substrate or printed circuit board.

In some embodiments, a method of forming a semiconductor package comprises joining an integrated circuit die to a package substrate or printed circuit board using a plurality of solder bumps located between the die and the package substrate or printed circuit board. A filler material is mixed in an underfill material to form a mixture. The mixture is dispensed to substantially fill a gap between the die and the package substrate or printed circuit board. The filler material is allowed to at least partially settle after the dispensing step. The underfill material is cured after the filler material at least partially settles.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 1:
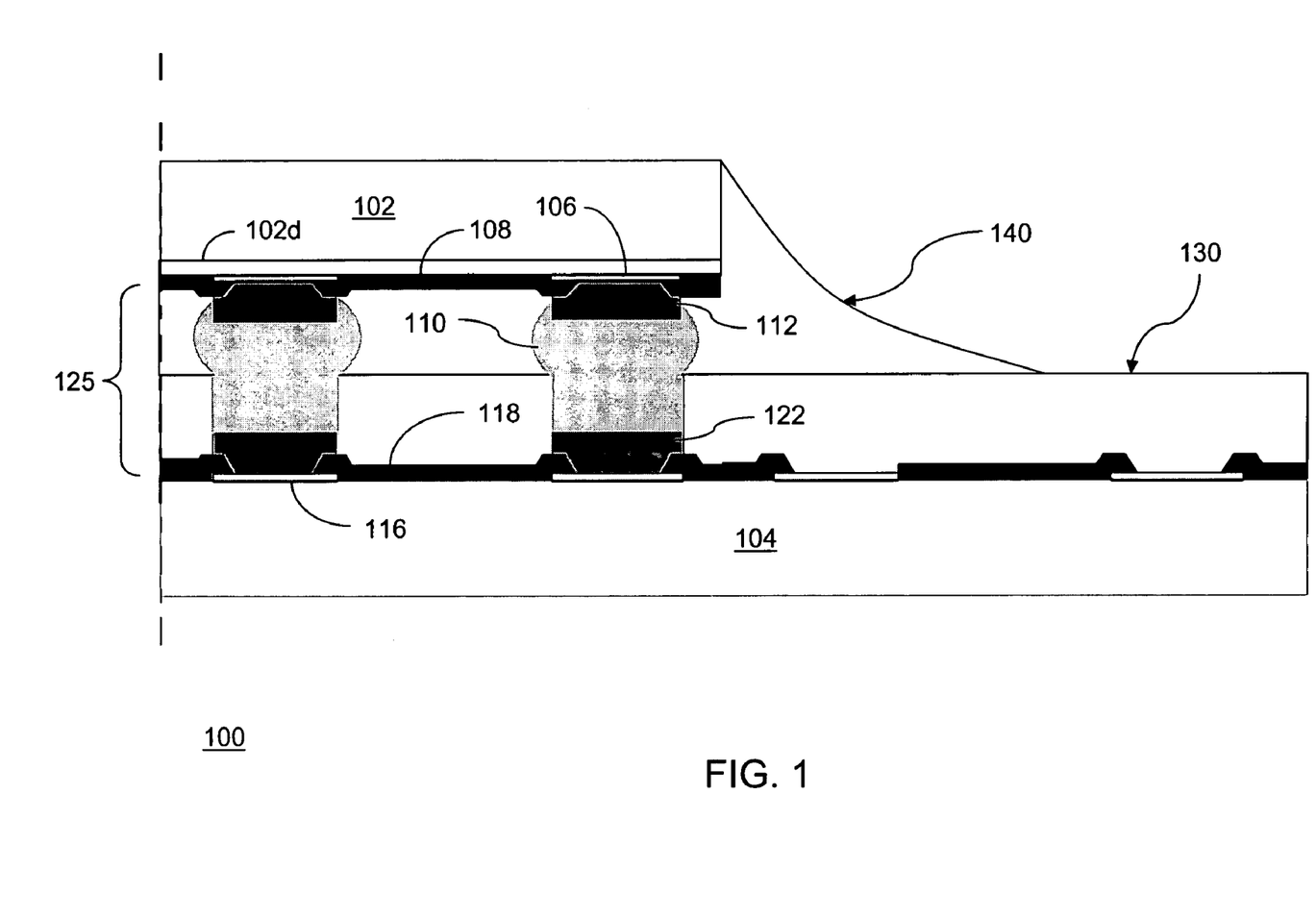
FIG. 1 is a cross sectional view of a first embodiment of a flip chip structure having a stratified underfill.

FIG. 1 is a cross sectional view of the right side of a flip chip structure 100 according to one embodiment. The structure 100 may be a semiconductor IC package or a printed circuit board having a die 102 directed mounted thereto by a flip chip method. The left side of the structure 100 is not shown in FIG. 1, but would appear substantially as a mirror image of the right side of the structure 100, and its inclusion in the figure is not necessary for an understanding of the method and structure of the embodiment of FIG. 1.

The structure 100 has a stratified underfill 125. The stratified underfill 125 includes multiple layers having one of the group consisting of: multiple coefficients of thermal expansion, multiple filler concentrations, filler concentration with gradient, and multiple filler particle sizes. Examples of each type of stratified underfill are provided below.

Structure 100 includes an integrated circuit die 102 including at least one dielectric layer 102d. Although FIG. 1 only shows one inter-layer dielectric (ILD) layer 102d for ease of viewing, one of ordinary skill understands that a plurality of interconnect layers is normally provided, including alternating metal and ILD layers. The ILD layer 102d may be a low-k dielectric layer having a dielectric constant (k) value below 3.9, and preferably has a k value less than about 3.0. Some embodiments have a k value of about 2.75. In some embodiments, the dielectric layer 102d is an ELK dielectric layer having a k value between 2.0 and 2.5. The die 102 may have a coefficient of thermal expansion (CTE) of about 3 ppm/C.

The die 102 has a plurality of conductive contact pads 106, which may be made of aluminum or other suitable metal or alloy. A patterned passivation layer 108 is applied over the die 102, leaving the contact pads 106 exposed. The passivation layer 108 may be formed of any suitable passivation material such as, but not limited to, for example, silicon oxide, silicon nitride, silicon oxy-nitride or other suitable passivation materials. The passivation layer 108 can be formed by CVD, PVD, spin-coating or other methods which are adapted to form a thin film layer. An under-bump metallization (UBM) 112 is applied over each contact pad 106. In some embodiments, the UBM 112 includes multiple layers of different metals, such as an adhesion layer, a diffusion barrier layer, a solderable layer, and an oxidation barrier layer. The UBM 112 may be a nickel/gold (Ni/Au) system, or other suitable metal or alloy or sequence of metals and/or alloys, such as, but not limited to Cr/Cr—Cu/CU, Ti/Ni—V, Ti/Cu, or Ti/W/Au. Successive UBM layers may be vacuum deposited by evaporation or sputtering, or be chemically plated at the wafer level.

The die 102 is attached to a substrate 104 using the flip chip technique. In some embodiments, the substrate 104 is a package substrate having a CTE of about 16 ppm/C. In other embodiments, the substrate 104 is a PCB formed of an organic material, a ceramic, or a silicon substrate. A plurality of solder bumps 110 form the interconnects between the contact pads 106 on the die 102 and corresponding contact pads 116 on the substrate 104. In some embodiments, the solder bumps 110 are initially joined to the die, using any suitable conventional or future developed method for applying bumps to an IC die. First, the contact pads 106 are exposed, for example, using a photolithography step. Then the UBM 112 is applied, as described above. After the UBM 112 is applied, the solder bumps 110 are applied. The solder bumps 110 may be formed or placed on the UBM 112 in many ways, including evaporation, electroplating, printing, jetting, stud bumping, or direct placement. Some embodiments include a eutectic solder. The solder may be high lead or lead free. In some embodiments, the solder bumps comprise lead concentration substantially less than about 5%. The solder can be, but is not limited to metals and alloys such as Sn, In, Ni, SnPb, SnIn, SnAg, SnBi, SnBiZn, SnAgIn, SnAgCu, SnBiIn, SnBiSb, SnAgBiIn, SnAgCuSb, SnAgBiSb, SnAgBiCuSb, or SnAgBiInSb.

The structure 100 has a stratified underfill 125 between the die 102 and the package substrate or printed circuit board 104. The stratified underfill 125 has at least two layers or regions, each layer or region having a respectively different CTE. In the embodiment of FIG. 1, the stratified underfill 125 has two distinct layers 130 and 140. In some embodiments, each layer 130, 140 of the stratified underfill 125 has a homogeneous composition, and the respective CTE is substantially constant within each layer 130, 140. In other embodiments, one or both of the layers may comprise two or more sub-layers having respectively different CTEs. In still other embodiments, one or both of the layers 130, 140 may have a CTE that varies in the thickness direction. For example, in some embodiments, the CTE may vary as an approximately linear or polynomial function that is greatest on the side of that layer facing the substrate 104, and is smallest on the side of the layer facing the die 102. In other embodiments, the CTE may vary substantially as a step function, with discrete increases in CTE in the thickness direction as the distance from the substrate 104 grows smaller.

The first underfill layer 130 is applied on the substrate 104. The first underfill 130 may be, for example, a polymeric material. Examples of underfill materials that can be used include epoxy resins (e.g., bisphenol A resins, bisphenol F resins, cycloaliphatic epoxy resins, and mixtures thereof), cyanate esters, siloxiranes, maleimides, polybenzoxazines, and polyimides.

The material of the first underfill layer 130 may contain hardeners (or crosslinking agents), catalysts, toughening agents, and fluxing agents. The first underfill layer 130 has a CTE that is relatively close to the CTE of the substrate 104, and is greater than the CTE of the second underfill layer 140. Preferred underfill materials for the first underfill layer have a CTE greater than 10 ppm/C. Preferably the material of first underfill layer 130 has a CTE between about 10 ppm/C and about 16 ppm/C. Depending on the underfill material used, the first underfill layer 130 may include a filler to optimize the CTE for a given configuration. The filler may be a powdered inorganic material, e.g., silica, alumina, carbon, or aluminum nitride, or mixtures thereof.

The first underfill 130 may be applied by a variety of methods, including, but not limited to, printing, spin coating, or dispensing. The thickness of the first underfill layer 130 is less than the size of the gap between the die 102 and the substrate 104 after joining the die to the substrate. For example the thickness of the layer 130 may be from about 0.2 to about 0.8 times the size of the gap between the die 102 and the substrate 104. In some embodiments, the thickness of the layer 130 is from about 0.4 to about 0.6 times the size of the gap between the die 102 and the substrate 104. In some embodiments, thickness of the layer 130 is about 0.5 times the size of the gap between the die 102 and the substrate 104.

The second underfill layer 140 is applied after die 102 is joined to the substrate 104. The second underfill layer 140 is dispensed into the gap between the die 102 and the first underfill layer 130, to completely fill the gap. In some embodiments, vacuum dispensing is used to dispense the second underfill layer 140 evenly and avoid gaps therein. The second underfill layer 140 comprises a material having a CTE less than 10 ppm/C. In some embodiments, the material of the second underfill layer has a CTE between about 7 ppm/C and about 9 ppm/C. An example of a material suitable for the second underfill layer 140 is a polyimide molding compound or a no-flow underfill encapsulant. Thermosetting materials are preferred. The second underfill layer 140 may also comprise a filler material to reduce the CTE thereof to a value that is closer to the CTE of the die 102 (where the die has a CTE of from about 3 ppm/C to about 5 ppm/C).

For the embodiment of FIG. 1, the solder bumps 110 may be applied using a bump-on-wafer process or a bump-on-substrate process. In some embodiments, the solder bumps 110 are applied to the wafer from which the die 102 is formed. A photolithographic process is used to expose the contact pads 106, and the UBM 112 is applied on the pads 106. Then the solder bumps 110 are joined to the die on the wafer. In other embodiments, the solder bumps 110 are applied to the substrate 104 before or after the first underfill layer 130 is applied.

The structure 100 of FIG. 1 is shown without solder bumps under the substrate 104. If the substrate 104 is the package substrate of a flip chip package, then a plurality of solder bumps would be attached to the bottom of the package, in the manner shown in FIGS. 2-5. If substrate 104 is a printed circuit board, to which die 102 is directly mounted, then the configuration would appear as shown in FIG. 1, without the bumps on the bottom of the substrate 104. Similarly, if the structure 100 is a land grid array chip scale package, then the structure 100 would not include solder bumps on the bottom of the substrate 104 (but the bottom surface of the substrate 104 would have pads thereon). Although FIG. 1 shows a direct mount flip chip configuration without bumps on substrate 104, and FIGS. 2-5 show flip chip packages 200, 300, 400 and 500 with respective bumps 224, 324, 424 and 524, any of the underfill embodiments shown in FIGS. 1-5 may be used either within an flip chip package or for directly mounting a flip chip to a PCB.

Figure 2:
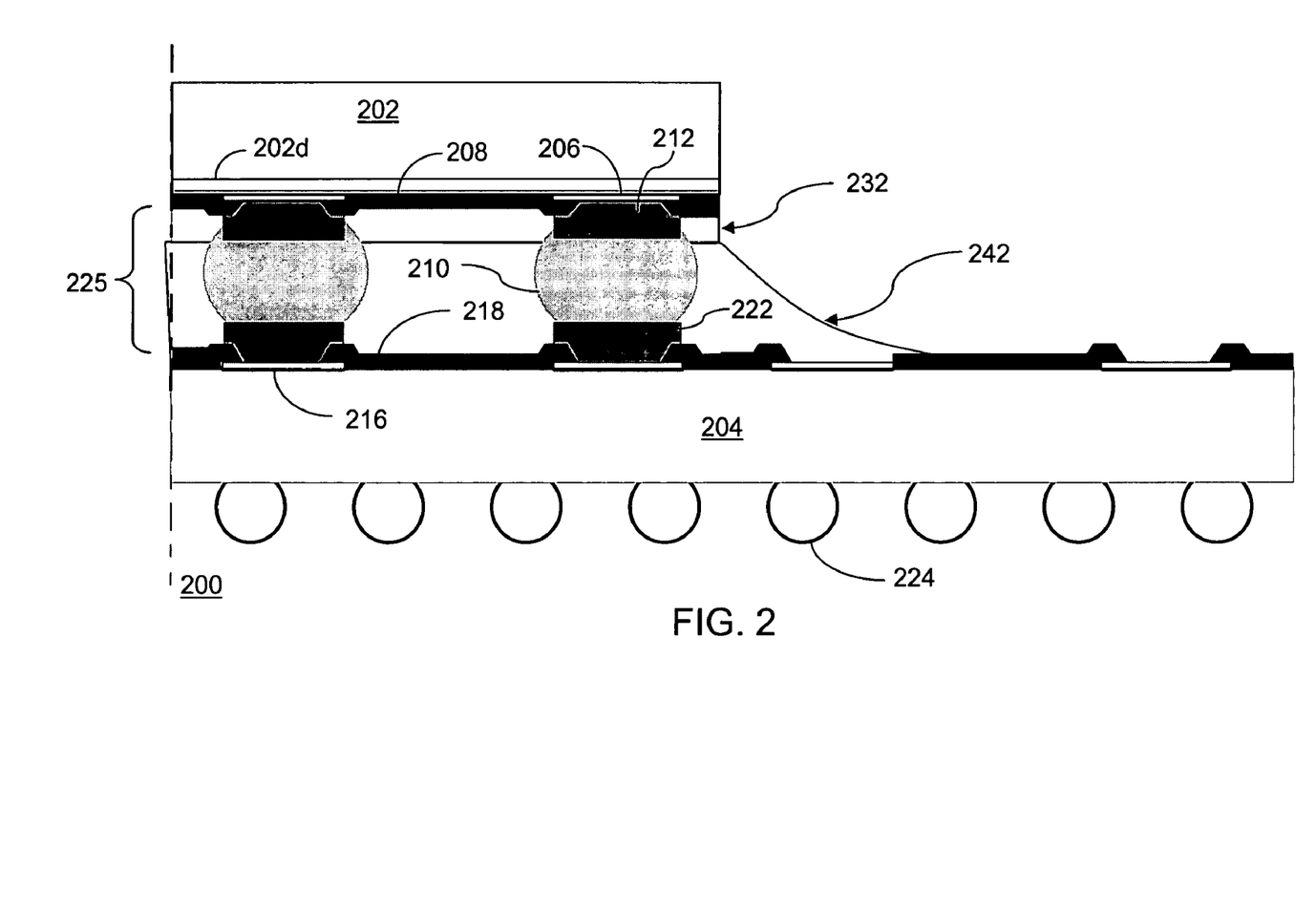
FIG. 2 is a cross sectional view of a second embodiment of a flip chip structure having a stratified underfill.

FIG. 2 is a cross sectional view of the right half of a structure according to a second embodiment. In FIG. 2 the substrate 204 is a package substrate having circuit traces (not shown) and vias (not shown) therein, and a plurality of solder bumps 224 for attachment to a PCB (not shown in FIG. 2).

In FIG. 2, items corresponding to items in FIG. 1 are indicated by reference numerals increased by 100. Unless otherwise indicated, the following corresponding items can be the same as those described above with reference to FIG. 1, and descriptions thereof are not repeated: die 202, dielectric layer 202d, substrate 204, contact pads 206 and 216, passivation layers 208 and 216, solder bumps 210, UBM 212 and 222.

The package 200 of FIG. 2 differs from the package 100 of FIG. 1 in that the stratified underfill 225 is formed in a different manner than the stratified underfill 125 of FIG. 1. The stratified underfill 225 is formed by forming the first underfill layer 232 on the wafer from which the die 202 is made. The first underfill layer 232 is applied to the wafer by printing, spin coating, or by dispensing. The first underfill layer 232 is formed of any material that can be used for the second underfill layer 140 of FIG. 1, as described above, and a complete listing of the examples provided above is not repeated. For example, layer 232 may comprise a non-flow filled underfill, molding compound or polyimide having a CTE less than 10 ppm/C, preferably between about 5 ppm/C and about 9 ppm/C. Because the first underfill layer is applied to the die 202, the solder bumps 210 are applied to UBM 212 of the die 202 after the first underfill layer 232 is applied.

The second underfill layer 242 is applied to fill the gap between the first underfill layer 232 and the package substrate 204. The second underfill layer 242 is applied by dispensing, for example, by vacuum dispensing. The second underfill layer 242 may comprise any material suitable for use in the first underfill layer 130 of FIG. 1, and a complete listing of the examples provided above is not repeated. Preferably, the second underfill layer 242 has a CTE greater than 10 ppm/C, and more preferably, between 10 ppm/C and about 16 ppm/C.

Because the embodiment of FIG. 2 allows the material of first underfill layer 232 to be deposited on the die by printing or spin coating, the first underfill layer 232 can be applied at the wafer level, instead of individually applying the first underfill material layer 232 for each die.

Figure 3:
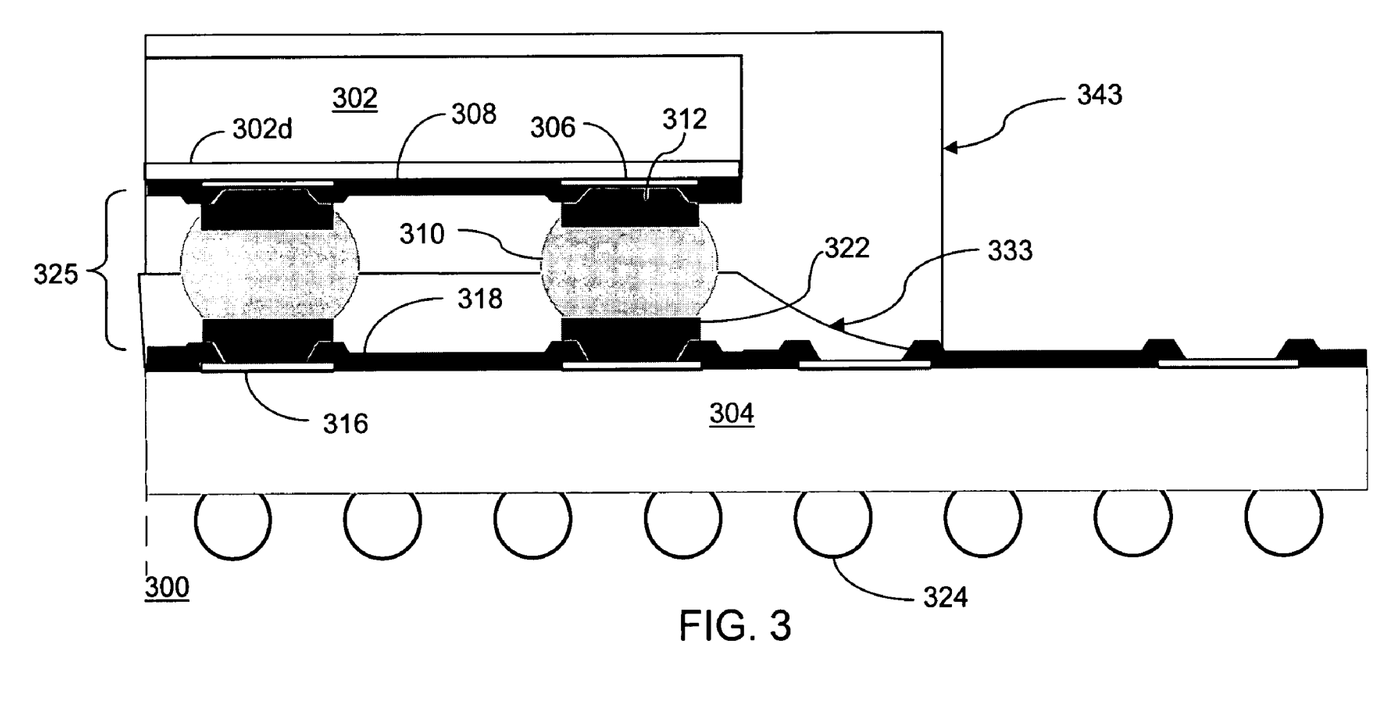
FIG. 3 is a cross sectional view of a third embodiment of a flip chip structure having a stratified underfill.

FIG. 3 is a cross sectional view of the right half of a structure according to a third embodiment. In FIG. 3 the substrate 304 is a package substrate having circuit traces (not shown) and vias (not shown) therein, and a plurality of solder bumps 324 for attachment to a PCB (not shown in FIG. 3).

In FIG. 3, items corresponding to items in FIG. 1 are indicated by reference numerals increased by 200. Unless otherwise indicated, the following corresponding items can be the same as those described above with reference to FIG. 1, and descriptions thereof are not repeated: die 302, dielectric layer 302d, substrate 304, contact pads 306 and 316, passivation layers 308 and 316, solder bumps 310, and UBM 312 and 322. Solder bumps 324 can be the same as bumps 224 described above with reference to FIG. 2.

The underfill 325 of package 300 includes a first layer 333 of an underfill material adjacent to the substrate 304, the first layer 333 having a thickness less than a size of a first gap between the die 302 and the package substrate 304 or printed circuit board. A second layer 343 contacts the die 302. The second layer 343 fills a second gap between the die 302 and the first layer 333. The second layer 343 is formed from a molding compound or other encapsulant that encapsulates the die 302.

In FIG. 3, the stratified underfill 325 comprises: a first underfill layer 333 applied adjacent to the substrate 304, and a second underfill or buffer layer 343 comprising an encapsulant material that is used to encapsulate the die 302. The second underfill layer 343 has a CTE less than the CTE of the first underfill layer 333. Preferably, the encapsulant material has a CTE less than 10 ppm/C, and the first underfill layer 333 has a CTE greater than 10 ppm/C.

The first underfill layer 333 may be any of the materials described above as suitable for use as the first underfill material 130 of FIG. 1, and the list of examples provided above is not repeated. The first underfill layer 333 may be dispensed onto the substrate 304 after the die 302 is attached thereto.

The second underfill layer or buffer layer 343 comprises a molding compound, a polyimide, or another encapsulant having a CTE less than 10 ppm/C. Preferably, the second underfill layer 343 is a molding compound having a CTE between about 5 ppm/C and about 9 ppm/C. The encapsulant may be dispensed using any encapsulation process, but it is preferable to include a vacuum step to draw the encapsulant in and eliminate any voids in the second underfill layer 343. Thus, the method of FIG. 3 allows elimination of the separate step of providing a second underfill layer separate from the encapsulant used to encapsulate the structure 100 of FIG. 1. (Note that the encapsulant is not shown in FIG. 1)

Figure 4:
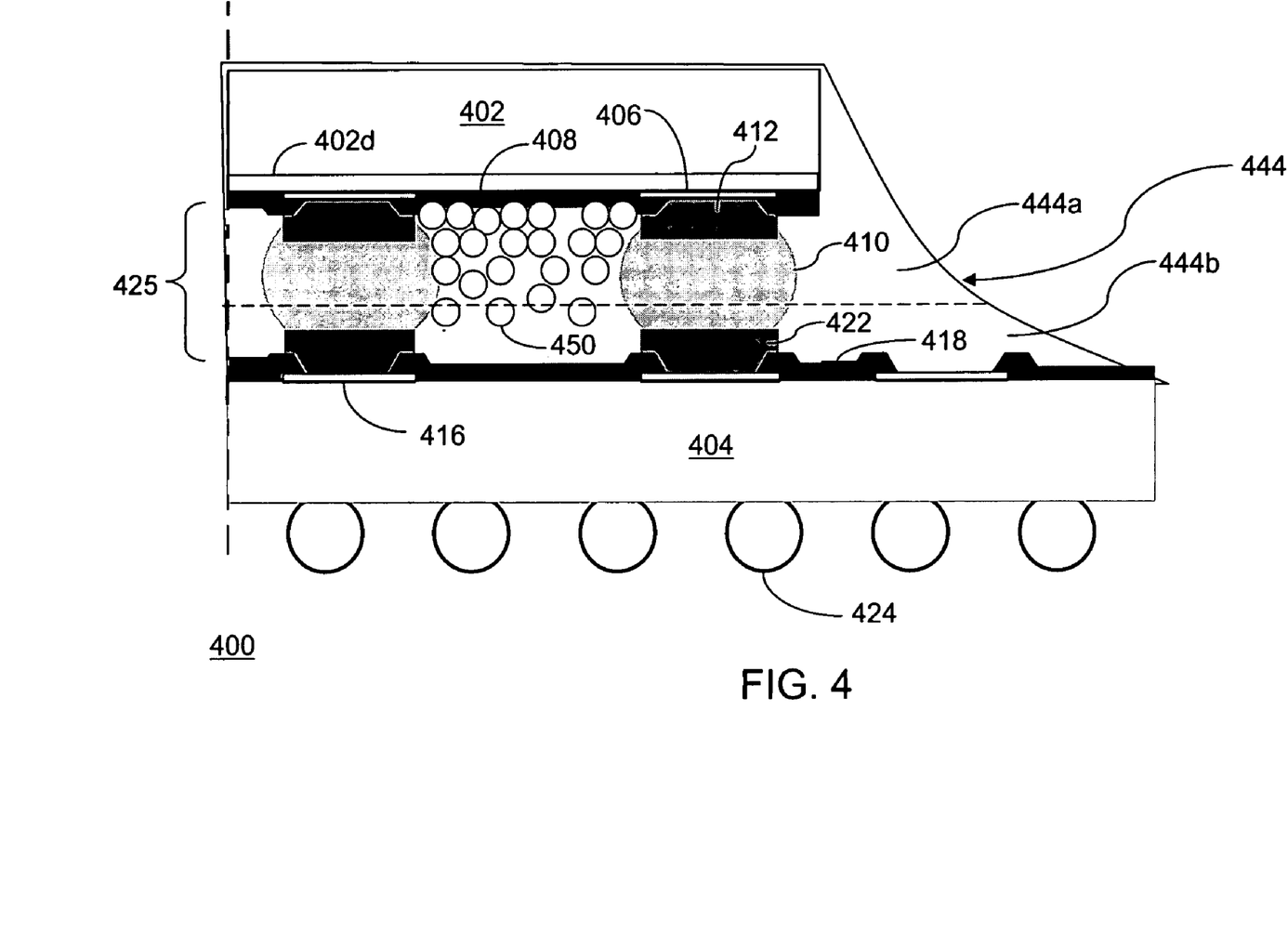
FIG. 4 is a cross sectional view of a fourth embodiment of a flip chip structure having a stratified underfill.

FIG. 4 is a cross section of another embodiment for forming a stratified underfill 425 having multiple layers 444a, 444b with respectively different concentrations of filler particles 450.

In FIG. 4, items corresponding to items in FIG. 1 are indicated by reference numerals increased by 300. Unless otherwise indicated, the following corresponding items can be the same as those described above with reference to FIG. 1, and descriptions thereof are not repeated: die 402, dielectric layer 402d, substrate 404, contact pads 406 and 416, passivation layers 408 and 416, solder bumps 410, and UBM 412 and 422. Solder bumps 424 can be the same as bumps 224 described above with reference to FIG. 2.

The method for forming the package 400 includes joining an integrated circuit die 402 to a package substrate 404 or printed circuit board using a plurality of solder bumps 410 located between the die 402 and the package substrate 404 or printed circuit board. A filler material 450 is mixed into an underfill material 444 to form a mixture. The mixture is dispensed to substantially fill a gap between the die 402 and the package substrate 404 or printed circuit board. The filler material 450 is allowed to at least partially settle after the dispensing step. Then, the underfill material 444 is cured after the filler material 450 at least partially settles.

In a typical configuration, the filler material 450 has a CTE that is lower than the CTE of the underfill material 444, so in order to provide a lower CTE nearer the die 402, the filler material 450 should settle in the portion of the gap closer to the die 402 and distal from the substrate 404. This can be accomplished by, for example, orienting the die 402 and package substrate 404 so that the substrate 404 is above the die 402, so that the filler material 450 gravitates towards the die 402. Other methods of causing the filler material 450 to settle near the die 402 are also contemplated, such as centrifuging the package, for example.

The filler material 450 can all be approximately the same size, as shown in FIG. 4, or the filler material can have particles of two or more sizes, as discussed below with reference to FIG. 5.

Referring again to FIG. 4, the filler material 450 may partially or completely settle, depending on the viscosity of the underfill material 444, the buoyancy of the filler particles 450 within the underfill material 444, and the amount of settling time allowed. As shown in the example, the filler material 450 is partially settled, so that the density of the filler particles 450 within the underfill material 444 varies in an approximately continuous fashion from zero close to the substrate 404 to a maximum value near the die 402. An imaginary plane (shown as a dashed line in FIG. 4) divides the stratified underfill 425 into two layers: a layer 444a adjacent to the die having a first concentration of filler particles 450, and a layer 444b having a second concentration of the filler particles 450 different from the first concentration. In some embodiments, the second concentration is substantially less than the first concentration.

In one embodiment, the concentration of the filler particles 450 is distributed with a gradient within the gap between the die 402 and the package substrate 404. A higher concentration of filler particles is closer to the die 402, and a lower concentration is near the package substrate 404. Therefore, the filler concentration with a gradient in the underfill provides a lower CTE near the die 402 and a higher CTE near the package substrate 404.

In some embodiments, the second concentration is substantially zero. For example, in the example of FIG. 4, the (second) concentration of the particles 450 below the dashed line is substantially zero. If the dashed line were drawn slightly lower, the second concentration would be equal to zero.

The embodiment of FIG. 4 allows formation of a stratified underfill 425 having two layers with respectively different CTE values, using a single underfill dispensing step. There is no need to print, spin coat or dispense a second underfill layer.

Figure 5:
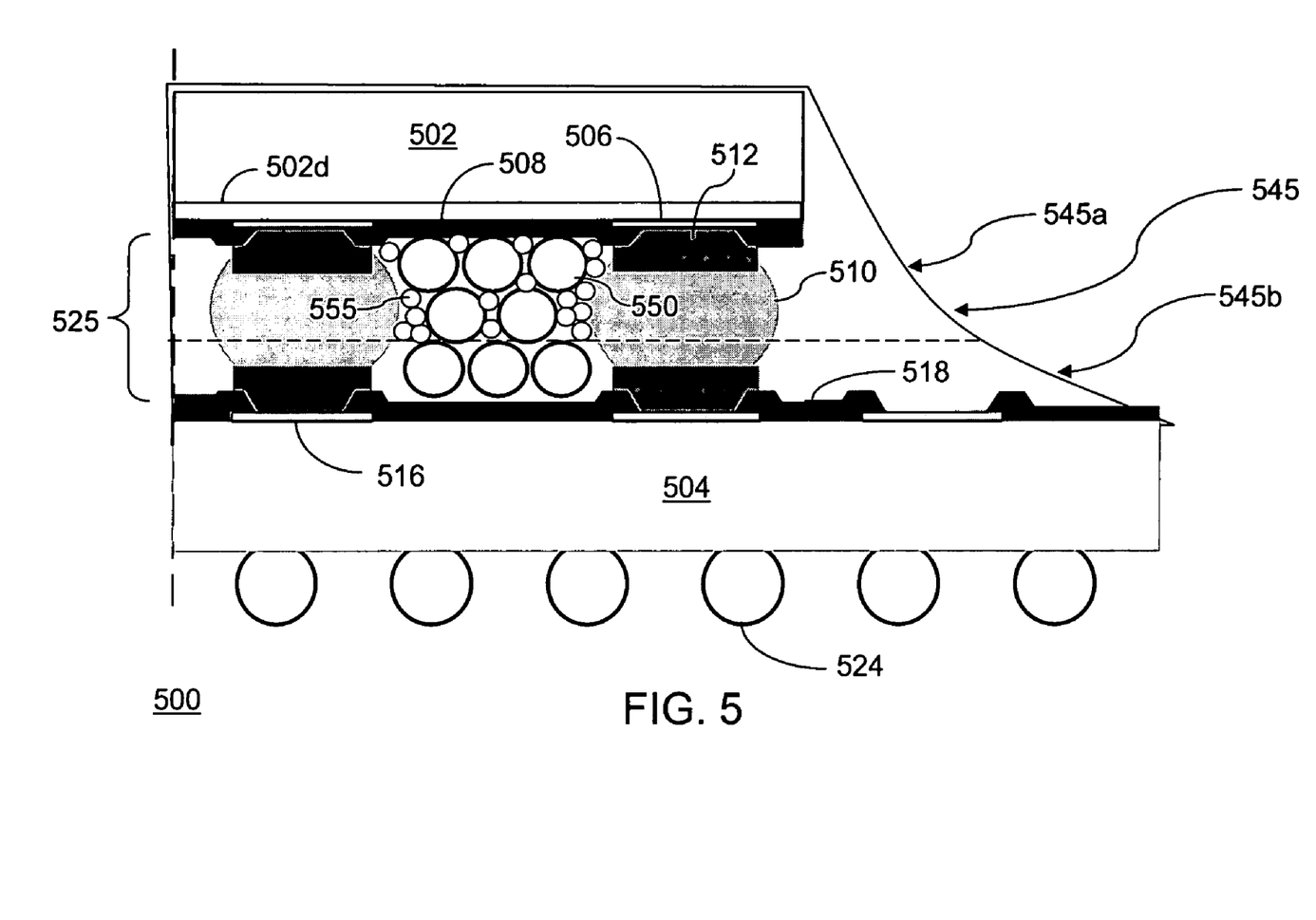
FIG. 5 is a cross sectional view of a fifth embodiment of a flip chip structure having a stratified underfill.

FIG. 5 is a cross sectional diagram of an embodiment having a stratified underfill 525 with multiple filler particle sizes.

In FIG. 5, items corresponding to items in FIG. 1 are indicated by reference numerals increased by 400. Unless otherwise indicated, the following corresponding items can be the same as those described above with reference to FIG. 1, and descriptions thereof are not repeated: die 502, dielectric layer 502d, substrate 504, contact pads 506 and 516, passivation layers 508 and 516, solder bumps 510, and UBM 512 and 522. Solder bumps 524 can be the same as bumps 224 described above with reference to FIG. 2.

In FIG. 5, the filler material comprises first filler particles 550 and second filler particles 555. The first filler particles 550 have a larger particle size than the second filler particles 555. In this example, The first filler particles 550 and second filler particles 555 settle to form a first layer 545a having a first concentration of the second filler particles 555 in interstices between the first filler particles 550, and a second layer 545b having a second concentration of the second filler particles 555 in interstices between the first filler particles 550.

The second concentration is substantially less than the first concentration. In FIG. 5, the second concentration of the second (smaller) filler particles 555 in the layer 545b adjacent the substrate is substantially zero. In other embodiments, the second concentration of the second (smaller) filler particles 555 in the layer 545b adjacent the substrate is a non-zero value substantially less than the first concentration of the second particles in the layer 545a.

In the example of FIG. 5, the particles 550 and 555 completely settle. With substantially all of the smaller particles 555 settled closer to the die 502, the CTE of the stratified underfill is similar to a step function. The combined density of the filler materials 550, 555 within the underfill material 545 is substantially greater in the first layer 545a than the combined density of the filler materials 550, 555 in the second layer 545b. Thus, the CTE is substantially lower in the layer 545a including the larger particles 550 and smaller particles 555, and relatively higher in the layer 545b containing only the larger particles 550.

Although FIG. 5 shows the first filler particles 550 extending close to the substrate 504, in other embodiments (not shown), there is a substantial gap between closest particle 550 and the substrate 504, essentially dividing the stratified underfill 525 into three layers. The first layer has large particles 550 with a relatively high concentration of small particles 555 in the interstices therebetween; the second layer has the large particles with a small or zero concentration of the small particles 555; and the third layer has substantially no filler particles 550 or 555 therein.

In one embodiment, the combined concentration of the filler particles 550, 555 is distributed with a gradient within the gap between the die 502 and the substrate 504. A higher concentration of filler particles is closer to the die 502, and a lower concentration is near the substrate 504. Therefore, the filler concentration with gradient in the underfill provides a lower CTE near the die 502 and a higher CTE near the substrate 504.

Although FIG. 5 only shows two different sizes of filler particles, other embodiments include three, four, or more particle sizes.

The method of forming the underfill 525 is similar to that employed with the underfill 425 of FIG. 4. The underfill material 545 is mixed with the first filler particles 550 and second filler particles 555 to form a mixture. The mixture is dispensed between the die 502 and the package substrate 504 or printed circuit board. The first and second filler particles are allowed to at least partially settle after the dispensing step, and then the underfill material 545 is cured after the settling. Preferably, the particles 550, 555 are allowed to completely settle, so as to provide a predictable concentration of the first particles 550 and second particles 555 in each layer, with a wide settle time window. That is, the particle concentrations in each layer 545a, 545b do not change once the particles 550, 555 completely settle, so there is no need to precisely control a settling time that achieves a particular desired particle distribution within the underfill material. As demonstrated in FIG. 5, by allowing the smaller particles to fill in the interstices between the larger particles, it is possible to achieve different combined densities of the filler material within the underfill material, so as to form layers with respectively different CTE values.

The embodiment of FIG. 5 allows formation of a stratified underfill 525 having two or three layers with respectively different CTE values, using a single underfill dispensing step.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor package comprising:
an integrated circuit die having at least one low-k dielectric layer joined to a package substrate or printed circuit board using a plurality of solder bumps located between the die and the package substrate or printed circuit board, the low-k dielectric layer having a dielectric constant of about 3.0 or less, the solder bumps having a lead concentration of about 5% or less;
an underfill layer between the die and the package substrate or printed circuit board; and
a buffer layer between the underfill layer and the, integrated circuit die.

2. The semiconductor package of claim 1, wherein the buffer layer has a coefficient of thermal expansion (CTE) less than a CTE of the underfill layer.

3. The semiconductor package of claim 1, wherein the buffer layer has coefficient of thermal expansion (GTE) less than 10 ppm/C.

4. The semiconductor package of claim 1, wherein the underfill layer has a coefficient of thermal expansion (CTE) greater than 10 ppm/C.

5. The semiconductor package of claim 1, wherein the low-k dielectric layer has a dielectric constant less than 2.75.

6. The semiconductor package of claim 1, wherein the buffer layer encapsulates the integrated circuit die.

7. The structure of claim 1, Wherein the buffer layer comprises an encapsulant material including a molding compound.

8. A structure comprising:
an integrated circuit die including at least one low-k dielectric layer having a, dielectric constant of about 3.0 or less;
a package substrate or printed circuit board;
a plurality of solder bumps located between the die and the package substrate or printed circuit board, the plurality of solder bumps having a lead concentration of about 5% or less; and
a stratified underfill layer between the die and the package substrate or printed circuit board.

9. The structure of claim 8, wherein:
the stratified underfill layer comprises a first layer and a second layer with substantially different coefficients of thermal expansion (CTE) from each other.

10. The structure of claim 9, wherein the first layer is adjacent to the integrated circuit die and has a CTE<10 ppm/C.

11. The structure of claim 9, wherein the second layer is adjacent to the package or printed circuit board and has a CTE>10 ppm/C.

12. The structure of claim 9, wherein the stratified underfill layer comprises a first layer adjacent to the integrated circuit die and a second layer adjacent to the package substrate or printed circuit board, wherein the first layer and second layer have substantially different filler concentrations from each other.

13. The structure of claim 12, wherein the first layer has a filler concentration greater than a filler concentration of the second layer.

14. The structure of claim 8, wherein:
the stratified underfill layer includes an underfill material and a gradient filler material structure.

15. The structure of claim 14, wherein the gradient filler material structure has a gradient filler concentration within a gap between the integrated circuit die and the package substrate, or print circuit board.

16. The structure of claim 8, wherein the stratified underfill layer comprises:
a first layer of an underfill material contacting the substrate, the first layer having a thickness less than a size of a first gap between the die and the package substrate or printed circuit board; and
a second layer contacting the die, the second layer filling a second gap between the die and the first layer, the second layer being formed from a molding compound that encapsulates the die.

17. A structure comprising:
an integrated circuit die including at least one low-k dielectric layer;
a package substrate or printed circuit board;
a plurality of solder bumps located between the die and the package substrate or printed circuit board; and
a stratified underfill layer between the die and the package substrate or printed circuit board, wherein the stratified underfill layer includes an underfill material and a gradient filler material structure, and
wherein the gradient filler material structure has a size of filler particles adjacent the integrated circuit die that is greater than a size of filler particles adjacent the package substrate or print circuit board.

18. The semiconductor package of claim 17, wherein the low-k dielectric material has a dielectric constant of about 3.0 or less, and the plurality of solder bumps havie a lead concentration of about 5% or less.

19. The semiconductor package of claim 18, wherein the low-k dielectric layer has a dielectric constant less than 2.75.

20. The structure of claim 18, wherein:
the stratified underfill layer comprises a first layer and a second layer with substantially different coefficients of thermal expansion (CTE) from each other.

21. The structure of claim 18, wherein the first layer is adjacent to the integrated circuit die and has a CTE<10 ppm/ C.

22. The structure of claim 18, wherein the second layer is adjacent to the package or printed circuit board and has a CTE>10 ppm/C.

* * * * *

UNITED STATES PATENT AND TRADEMARK OFFICE
CERTIFICATE OF CORRECTION

PATENT NO. : 7,656,042 B2  Page 1 of 1
APPLICATION NO. : 11/393050
DATED : February 2, 2010
INVENTOR(S) : Mirng-Ji Lii et al.

It is certified that error appears in the above-identified patent and that said Letters Patent is hereby corrected as shown below:

Column 9, line 66, Claim 3, delete "(GTE)" and insert -- (CTE) --.

Column 10, line 8, Claim 7, delete "Wherein" and insert -- wherein --.

Signed and Sealed this

Thirteenth Day of April, 2010

David J. Kappos
*Director of the United States Patent and Trademark Office*